(12) United States Patent
Koyama et al.

(10) Patent No.: US 6,281,865 B1
(45) Date of Patent: Aug. 28, 2001

(54) DRIVING CIRCUIT OF LIQUID CRYSTAL DISPLAY DEVICE

(75) Inventors: Jun Koyama; Yukio Tanaka, both of Kanagawa; Yasushi Kubota; Tamotsu Sakai, both of Nara, all of (JP)

(73) Assignees: Semiconductor Energy Laboratory Co., Ltd., Kanagawa (JP); Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/150,933

(22) Filed: Sep. 10, 1998

(30) Foreign Application Priority Data

Sep. 11, 1997 (JP) .................................................. 9-268148

(51) Int. Cl.[7] ................................................... G09G 3/36
(52) U.S. Cl. ............................. 345/87; 345/92; 345/205; 345/100; 345/98; 345/206
(58) Field of Search .......................... 345/87, 55, 98, 345/99, 92, 206, 205, 100; 359/80, 85, 60; 349/158, 82, 187

(56) References Cited

U.S. PATENT DOCUMENTS

| | | | |
|---|---|---|---|
| 5,148,301 | * | 9/1992 | Sawatsubashi et al. ............... 345/87 |
| 5,589,847 | * | 12/1996 | Lewis ...................................... 345/98 |
| 5,619,222 | * | 4/1997 | So .......................................... 345/87 |
| 5,674,758 | * | 10/1997 | McCarthy .............................. 345/87 |
| 5,751,261 | * | 5/1998 | Zavracky et al. ...................... 345/55 |
| 6,064,362 | * | 5/2000 | Brownlow .............................. 345/98 |
| 6,108,055 | * | 8/2000 | Oima et al. ........................... 345/206 |
| 6,127,998 | * | 8/2000 | Ichikawa et al. ..................... 345/100 |

* cited by examiner

Primary Examiner—Richard Hjerpe
Assistant Examiner—Ali Zamani
(74) Attorney, Agent, or Firm—Eric J. Robinson; Nixon Peabody LLP

(57) ABSTRACT

A driving circuit of a liquid crystal display device including a first insulating substrate on which a plurality of signal lines and a plurality of scan lines are disposed, and pixel transistors made of thin film transistors are disposed in matrix at intersection points of those lines; a second insulating substrate opposite to the first insulating substrate; and a liquid crystal held between the first and second insulating substrates, in which the driving circuit is disposed on the first insulating substrate; each of clock lines or base portions of the clock lines for supplying clock signals to the driving circuit is made of a two-layer structure of the same wiring material as a gate electrode of the thin film transistor and the same wiring material as a source electrode or drain electrode of the thin film transistor; and a wiring line crossing the clock lines or the base portions of the clock lines is made of a wiring line in the same layer as a black matrix covering the pixel transistors.

20 Claims, 19 Drawing Sheets

DRIVER CIRCUIT TFT ← | → PIXEL TFT

1st STAGE     2nd STAGE   ••••    300th STAGE

FIG. 9

*video cap    Temperature: 27.0

DRIVING CIRCUIT OF LIQUID CRYSTAL DISPLAY DEVICE

BACKGROUND OF THE INVENTION

1. Field of the Invention

The present invention relates to a driving circuit of a liquid crystal display device, and particularly to a driving circuit for driving signal lines.

2. Description of the Related Art

As a liquid crystal display device having a built-in driving circuit for signal lines and scan lines, there is known a device manufactured by using thin film transistors made of polysilicon.

FIG. 2 is a schematic view showing a conventional liquid crystal display device having a built-in driving circuit.

In FIG. 2, signal lines 206, 207 and 208 are arranged in the row direction, scanning lines 203, 204 and 205 are arranged in the column direction, and pixel transistors 224 and 225 are arranged in matrix at intersection points of those lines. A gate terminal of the thin film transistor 224 is connected to the scanning line 203, a source terminal thereof is connected to the signal line 206, and a drain terminal thereof is connected to a pixel electrode 226.

Each of the signal lines is designed to input a video signal inputted from a video input terminal to the source terminal of the pixel transistor, and is driven by a signal line driving circuit 201. Each of the scan lines is designed to input a scanning signal to the gate terminal of the pixel transistor and is driven by a scan line driving circuit 202.

The signal line driving circuit 201 is constituted by a shift register 216 and analog switches 218, 219 and 220. This system is called dot-sequential driving, and is common in a liquid crystal display device having a built-in driving circuit.

The shift register includes an input terminal 215 for inputting a start pulse, clock input terminals 208 and 209 for sequentially shifting a pulse, and power supply terminals 213 and 214. The outputs 221, 222 and 223 of the shift register are connected to the analog switches 218, 219 and 220.

FIG. 3 shows operation waveforms of the shift register.

When clock pulses CL1 and CL1b are inputted, a start pulse is shifted according to rising and falling of the clock.

As a result, an analog switch selection pulse is outputted to the respective outputs of the shift register.

This output is inputted to the analog switches 218, 219 and 220, and the respective analog switches are turned on only during the period of the pulse. When the analog switch is turned on, the video line 210, 211, or 212 and the signal line 206, 207 or 208 at both ends of the analog switch are short-circuited during the period, and data of the video line are written into the signal line. The data written into the signal line are inputted into pixel transistor connected to the selected scan line and are written into the pixel electrode.

The transmittance of a liquid crystal is changed by voltage between the pixel electrode and the opposite substrate so that gradation display is made.

FIGS. 4 and 5 show manufacturing steps of a conventional liquid crystal display device.

Manufacturing steps of obtaining a conventional monolithic type active matrix circuit will be described below with reference to FIGS. 4 and 5. The steps relate to a low temperature polysilicon process. The left sides of FIGS. 4 and 5 show manufacturing steps of a TFT of a driving circuit and the right sides thereof show manufacturing steps of a TFT of an active matrix circuit, respectively.

First, a silicon oxide film with a thickness of 1000 to 3000 Å is formed as an underlayer oxide film 402 on a glass substrate 401. As a method of forming the silicon oxide film, it is appropriate to use a sputtering method or a plasma CVD method in an oxygen atmosphere.

Then an amorphous silicon film with a thickness of 300 to 1500 Å, preferably 500 to 1000 Å is formed by a plasma CVD method or an LPCVD method. Then heat annealing is carried out at a temperature of 500° C. or more, preferably 500 to 600° C. to crystallize the silicon film or to raise crystallinity thereof. The crystallinity may further be raised by light (laser or the like) annealing after the crystallization by the heat annealing.

Moreover, at the crystallization by the heat annealing, an element (catalytic element) for promoting crystallization of silicon may be added as disclosed in Japanese Patent Unexamined Publication No. Hei. 6-244103 and No. Hei. 6-244104.

Next, the silicon film is etched to form an active layer 403 (for a P-channel TFT) and an active layer 404 (for an N-channel TFT) of the island-like driving circuit, and an active layer 405 of a TFT (pixel TFT) of the matrix circuit. Further, a gate insulating film of silicon oxide with a thickness of 500 to 2000 Å is formed by a sputtering method in an oxygen atmosphere. A plasma CVD method may be used for the method of forming the gate insulating film. In the case where the silicon oxide film is formed by the plasma CVD method, it was preferable to use nitrous oxide ($N_2O$) or oxygen ($O_2$) and monosilane ($SiH_4$) as a raw material gas.

Thereafter, aluminum with a thickness of 2000 to 6000 Å is formed on the entire surface of the substrate by a sputtering method. Here, aluminum may contain silicon, scandium, palladium, or the like so as to prevent hillocks from occurring by a subsequent thermal process. This is etched to form gate electrodes 407, 408 and 409 (FIG. 4A).

Next, this aluminum is subjected to anodic oxidation. The surfaces of the aluminum become aluminum oxides 410, 411, and 412 by the anodic oxidation so that they come to have effects as insulators (FIG. 4B).

Next, a mask 413 of photoresist covering the active layer of the P-channel TFT is formed. Then phosphorus is implanted by an ion doping method with phosphine as a doping gas. The dosage is made $1 \times 10^{12}$ to $5 \times 10^{13}$ atoms/cm$^2$. As a result, high N-type regions (source, drain) 414 and 415 are formed (FIG. 4C).

Next, a mask 416 of photoresist covering the active layer of the N-channel TFT and the active layer of the pixel TFT is formed. Then boron is implanted again by an ion doping method with diborane ($B_2H_6$) as a doping gas. The dosage is made $5 \times 10^{14}$ to $8 \times 10^{15}$ atoms/cm$^2$. As a result, P-type regions 417 are formed. By the above doping steps, the high N-type regions (source, drain) 414 and 415, and the high P-type regions (source, drain) 417 are formed (FIG. 4D).

Thereafter, heat annealing at 450 to 850° C. for 0.5 to 3 hours is carried out to repair damages produced by doping and to activate doping impurities so that crystallinity of silicon is recovered. Then a silicon oxide film with a thickness of 3000 to 6000 Å is formed as an interlayer insulating film 418 on the entire surface by a plasma CVD method. This film may be a silicon nitride film or a multilayer film of a silicon oxide film and a silicon nitride film. Then the interlayer insulating film 418 is etched by a wet etching method or a dry etching method to form contact holes to the source/drain.

Then an aluminum film or a multilayer film of titanium and aluminum with a thickness of 2000 to 6000 Å is formed by a sputtering method. This film is etched to form electrode/wiring lines 419, 420, and 421 of the peripheral circuit and electrode/wiring lines 422 and 423 of the pixel TFT (FIG. 5E).

Further, polyimide with a thickness of 10000 Å is applied to form a second interlayer film 424. Next, titanium with a thickness of 2000 to 3000 Å is formed and is etched to form a black matrix 426 on the TFT. Further, polyimide with a thickness of 5000 to 6000 Å is applied to form a third interlayer film. Next, the second and third interlayer films are etched to form a contact hole reaching the electrode 423 of the TFT. Finally, an ITO (indium-tin oxide) film formed by a sputtering method and having a thickness of 500 to 1500 Å is etched to form a pixel electrode 425. In this way, the peripheral driving circuit and the active matrix circuit are integrally formed (FIG. 5F).

FIG. 6 shows a pattern of a conventional shift register. Numerals 501 to 506 indicate clock lines and numerals 507 and 508 indicate power supply terminals, respectively.

In a driving circuit of a conventional liquid crystal display device, in the case where clock wiring lines, video signal wiring lines, and control wiring lines of a shift register are formed, those wiring lines are formed at the same time as source and drain electrodes of a thin film transistor. The source/drain electrodes are used because the sheet resistance thereof is normally lower than a gate electrode material. In general, aluminum is used for the source/drain electrodes and the sheet resistance thereof is 0.1 Ω to 0.2 Ω.

As parasitic capacitance added to those wiring lines, inter-wiring capacitance between other wiring lines, and cross capacitance are conceivable. The inter-wiring capacitance has relation shown in FIG. 7, and as an interval between wiring lines becomes wide, the capacitance becomes small.

In the case where it is desired to raise frequencies of signals to be transmitted through the clock lines, video lines, control signal lines and the like, the foregoing wiring resistance and parasitic capacitance lower the frequency characteristics, which becomes a problem.

Here, it is assumed that the shift register shown in FIG. 6 has 300 stages, one stage being 250 $\mu$m. The explanation will be hereinafter made under this condition.

In the forgoing case where a wiring line and other wiring line cross each other, it is general to make crossing with gate electrode wiring lines. In this case, first interlayer film capacitance becomes parasitic capacitance.

When the interlayer film is formed of an oxide film with a thickness of 5000 Å and the width of a cross wiring line is 5 $\mu$m, the parasitic capacitance is 0.069 fF/$\mu$m$^2$*5 $\mu$m*30 $\mu$m=10.3 fF. When there are 1.66 cross points for the foregoing wiring line of 250 $\mu$m, parasitic capacitance of 10.3 fF*1.66=17.1 fF is generated. Besides, when the interval of wiring lines is 5 $\mu$m, the inter-wiring capacitance becomes 0.063 fF/$\mu$m*250 $\mu$m*2=31.5 fF per 250 $\mu$m. In total, capacitance becomes 48.6 fF.

Figure 9:
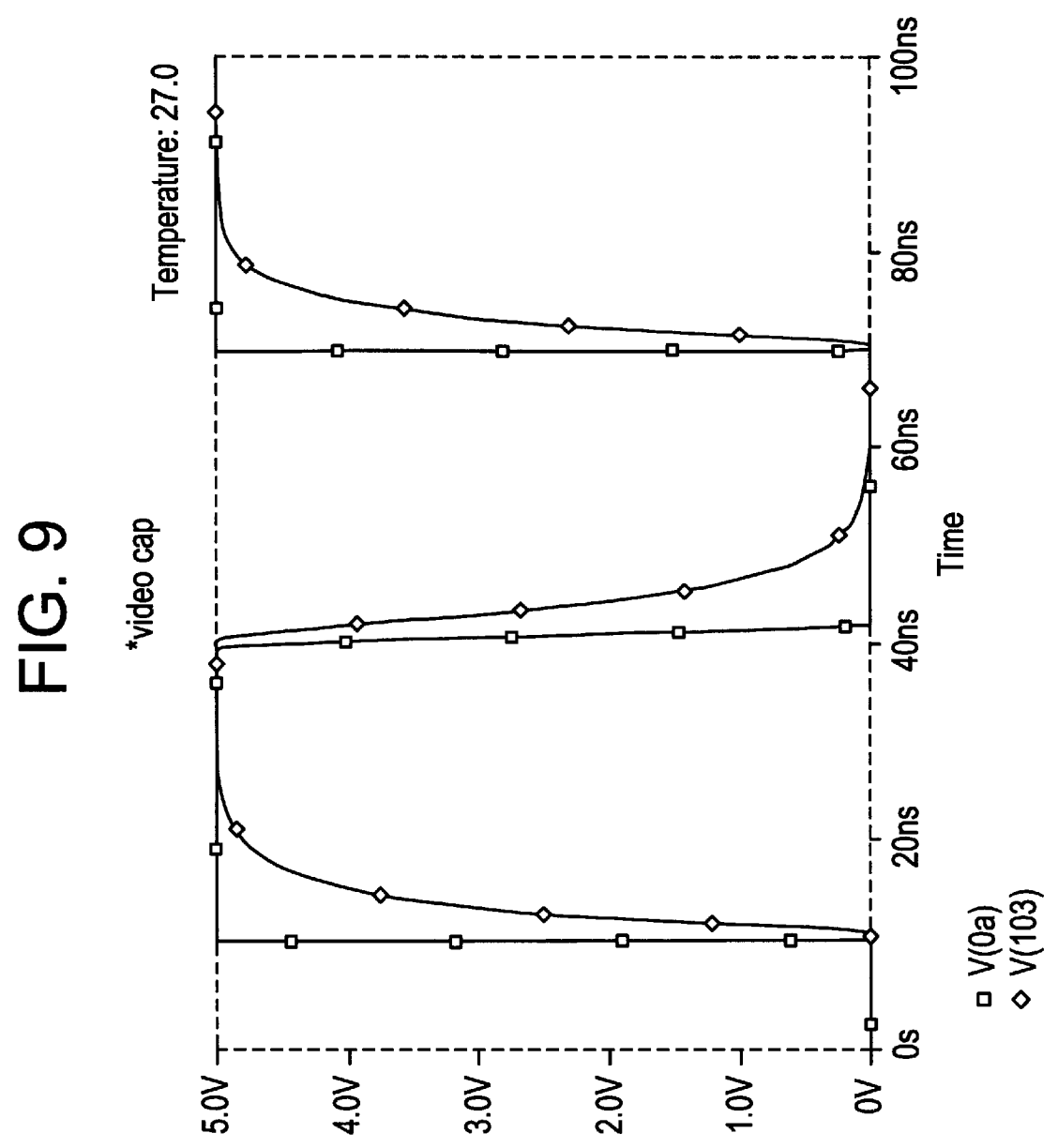

FIG. 9 shows the result of simulation for a delay amount under the assumption that the shift register is equivalent to a 300-stage resistor/capacitor ladder circuit shown in FIG. 8. The delay time is 2.8 ns, and in the case where the frequency is ten and several MHz, the rate of delay is 5%.

The same is true for a video signal line subjected to sampling by an analog switch. FIG. 10 is a plan view showing a conventional analog switch. Numerals 901 to 903 are denoted as video signal lines, numerals 904 to 909 are denoted as outputs of the shift register, numerals 910 to 912 are denoted as signal lines, and numerals 913 to 918 are denoted as analog switch transistor, respectively.

It is assumed that RGB three colors are made one, a pitch is 300 $\mu$m, and the number of stages is 300. When the wiring width is 30 $\mu$m, 300 $\mu$m, the wiring resistance becomes 2 Ω.

Similarly to the shift register, in the case where the video signal line and other wiring line cross each other, it is general that crossing is made at gate electrode wiring lines. In this case, interlayer film capacitance becomes parasitic capacitance.

When the interlayer film is formed of an oxide film with a thickness of 500 nm and the width of the cross wiring line is 5 $\mu$m, parasitic capacitance is 0.069 fF/$\mu$m$^2$*5 $\mu$m*30 $\mu$m=10.3 fF. If 8 cross points exist for the video signal line of 300 $\mu$m, the parasitic capacitance of 10.3 fF*8=82.8 fF is generated. The inter-wiring capacitance becomes 37.8 fF, and the total capacitance becomes 120.6 fF per 300 $\mu$m.

FIG. 11 shows the result of simulation of a delay amount similarly to the clock line. The delay time was 8.25 ns, and the delay was larger than the clock line.

In the case where the delay time is large or wiring capacitance is large, the following become problems for a display device.

(1) A time delay in a clock line causes a shift delay in shift of a shift register by the amount of the delay. Moreover, not only a clock delay but also waveform distortion is generated, which causes inferior operation of the shift register. The distortion in a video signal line causes the same data to be written in plural columns on a picture screen or pixels to be blurred, so that the picture quality is degraded.

(2) When inter-wiring capacitance becomes large, mutual interference between clock lines, and mutual interference between video signal lines are generated, which also causes the deterioration of picture quality.

(3) When the inter-wiring capacitance becomes large, and in the case where the clock line and video signal line are driven from the outside, large driving power of an external driving circuit is required and the consumption of electricity also becomes large.

As the capacitance load becomes large, the external driving circuit becomes large and the cost is increased. When a feedback amplifier such as an operational amplifier is used for the external driving circuit, erroneous operations such as oscillation are induced by the capacitance load, which also causes the deterioration of picture quality.

SUMMARY OF THE INVENTION

The present invention has been made in view of the above problems, and an object of the present invention is to provide a driving circuit of a liquid crystal display device in which a shift in timing is small, high picture quality can be provided, a load on an external circuit is lightened, and consumption of electricity is reduced.

According to an aspect of the present invention, a driving circuit of a liquid crystal display device comprising a first insulating substrate on which a plurality of signal lines and a plurality of scan lines are disposed, and pixel transistors made of thin film transistors are disposed in matrix at intersection points of those lines; a second insulating substrate opposite to the first insulating substrate; and a liquid crystal held between the first and second insulating substrates, wherein the driving circuit is disposed on the first insulating substrate; each of clock lines or base portions of the clock lines for supplying clock signals to the driving circuit is made of a two-layer structure of the same wiring material as a gate electrode of the thin film transistor and the same wiring material as a source electrode or a drain electrode of the thin film transistor; and a wiring line crossing the clock lines or the base portions of the clock lines is made of a wiring line in the same layer as a black matrix covering the pixel transistors.

According to another aspect of the present invention, a driving circuit of a liquid crystal display device comprising a first insulating substrate on which a plurality of signal lines and a plurality of scan lines are disposed, and pixel transistors made of thin film transistors are disposed in matrix at intersection points of those lines; a second insulating substrate opposite to the first insulating substrate; and a liquid crystal held between the first and second insulating substrates, wherein the driving circuit is disposed on the first insulating substrate; each of clock lines or base portions of the clock lines for supplying clock signals to the driving circuit is made of a two-layer structure of the same wiring material as a gate electrode of the thin film transistor and the same wiring material as a source electrode or a drain electrode of the thin film transistor; a wiring line crossing the clock lines or the base portions of the clock lines is made of a wiring line in the same layer as a black matrix covering the pixel transistors; and a wiring interval between adjacent ones of the clock wiring lines or the base portions of the clock wiring lines is wider than a width of each of the clock wiring lines or the base portions of the clock wiring lines.

According to still another aspect of the present invention, a driving circuit of a liquid crystal display device comprising a first insulating substrate on which a plurality of signal lines and a plurality of scan lines are disposed, and pixel transistors made of thin film transistors are arranged in matrix at the intersection points of those lines; a second insulating substrate opposite to the first insulating substrate; and a liquid crystal held between the first and second insulating substrates, wherein the driving circuit is formed on the first insulating substrate; a plurality of clock lines for supplying clock signals to the driving circuit are disposed; and a shield line biased at a fixed potential is disposed between the clock lines or base portions of the clock lines.

According to yet another aspect of the present invention, a driving circuit of a liquid crystal display device comprising a first insulating substrate on which a plurality of signal lines and a plurality of scan lines are disposed, and pixel transistors made of thin film transistors are disposed in matrix at intersection points of those lines; a second insulating substrate opposite to the first insulating substrate; and a liquid crystal held between the first and second insulating substrates, wherein the driving circuit is formed on the first insulating substrate; each of video signal lines or base portions of the video signal lines for supplying video signals to the driving circuit is made of a two-layer structure of the same wiring material as a gate electrode of the thin film transistor and the same wiring material as a source electrode or drain electrode of the thin film transistor; and a wiring line crossing the video signal lines or the base portions of the video signal lines is made of a wiring line in the same layer as a black matrix covering the pixel transistors.

According to another aspect of the present invention, a driving circuit of a liquid crystal display device comprising a first insulating substrate on which a plurality of signal lines and a plurality of scan lines are disposed, and pixel transistors made of thin film transistors are disposed in matrix at intersection points of those lines; a second insulating substrate opposite to the first insulating substrate; and a liquid crystal held between the first and second insulating substrates, wherein the driving circuit is formed on the first insulating substrate; each of video signal lines or base portions of the video signal lines for supplying video signals to the driving circuit is made of a two-layer structure of the same wiring material as a gate electrode of the thin film transistor and the same wiring material as a source electrode or drain electrode of the thin film transistor; a wiring line crossing the video signal lines or the base portions of the video signal lines is made of a wiring line in the same layer as a black matrix covering the pixel transistors; and a wiring interval between adjacent ones of the video signal lines or the base portions of the video signal lines is wider than a width of each of the video signal lines or the base portions of the video signal lines.

According to still another aspect of the present invention, a driving circuit of a liquid crystal display device comprising a first insulating substrate on which a plurality of signal lines and a plurality of scan lines are disposed, and pixel transistors made of thin film transistors are disposed in matrix at intersection points of those lines; a second insulating substrate opposite to the first insulating substrate; and a liquid crystal held between the first and second insulating substrates, wherein the driving circuit is formed on the first insulating substrate; a plurality of video signal lines for supplying video signals to the driving circuit are disposed; and a shield line biased at a fixed potential is disposed between the plurality of video signal lines or base portions of the video signal lines.

The driving circuit of the liquid crystal display device according to the present invention has the following effects.

1. With respect to the clock lines, the wiring line is made of the two-layer structure of the gate electrode material and the source/drain electrode material, and other wiring line crossing the clock lines is made in the same layer as the black matrix, so that the wiring resistance and parasitic capacitance can be reduced and the frequency characteristics can be improved.

2. With respect to the clock lines, the wiring interval is made wider than the wiring width, so that the inter-wiring capacitance can be reduced and the frequency characteristics can be improved.

3. With respect to the clock lines, the shield line is disposed between wiring lines so that the mutual interference between the wiring lines can be reduced.

4. With respect to the video signal lines, the wiring line is made of the two-layer structure of the gate electrode material and the source/drain electrode material, and other wiring line crossing the video signal lines is made in the same layer as the black matrix, so that the wiring resistance and parasitic capacitance can be reduced and the frequency characteristics can be improved.

5. With respect to the video signal lines, the wiring interval is made wider than the wiring width, so that the inter-wiring capacitance can be reduced and the frequency characteristics can be improved.

6. With respect to the video signal lines, the shield line is disposed between wiring lines so that the mutual interference between the wiring lines can be reduced.

BRIEF DESCRIPTION OF THE DRAWINGS

In the accompanying drawings:

FIG. 9 is a view showing the result of wiring delay time simulation of a conventional shift register;

DETAILED DESCRIPTION OF THE PREFERRED EMBODIMENTS

Preferred embodiment of the present invention will now be described below.

(Embodiment 1)

Figure 12A:
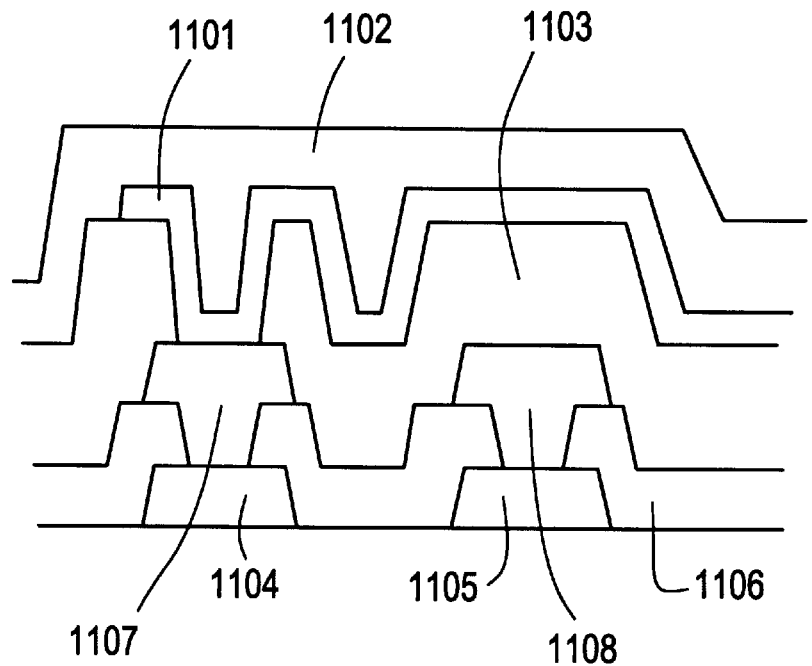
FIG. 12A is a sectional view showing a wiring line of the present invention.
Figure 12B:
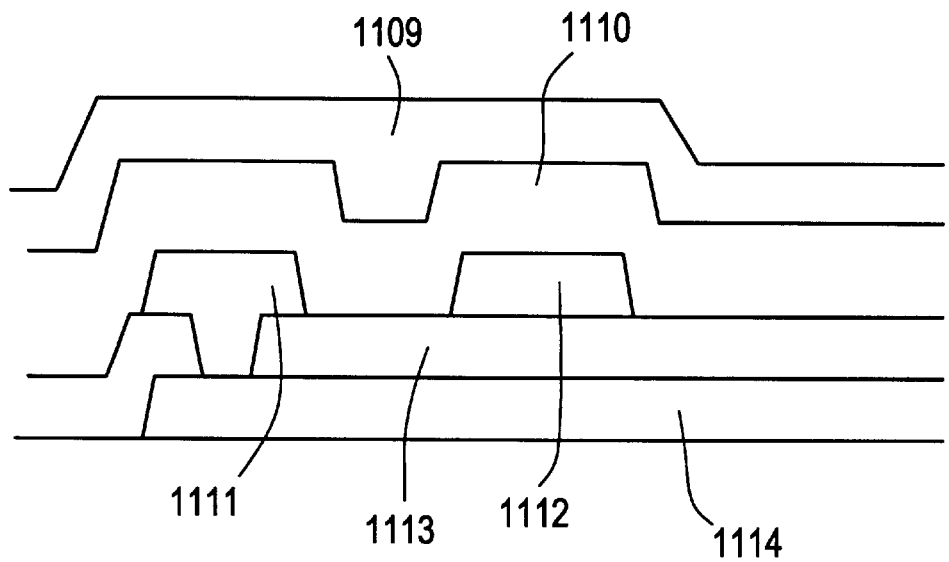
FIG. 12B is a sectional view showing a wiring line of the prior art.

FIG. 12A is a sectional view showing a clock wiring portion of a driving circuit using the present invention. As compared with the prior art (shown in FIG. 12B), clock wiring lines are made of two layers of gate electrodes 1104 and 1105 and source electrodes 1107 and 1108, so that wiring resistance becomes low. Moreover, since a cross wiring line is changed from a gate electrode wiring line 1114 in FIG. 12B to a black matrix wiring line 1101 in FIG. 12A, an interlayer film which forms parasitic capacitance is changed from a first interlayer film 1113 in FIG. 12B to a second interlayer film 1103 in FIG. 12A. Thus, the interlayer film becomes thick two times and the capacitance is reduced. Also, numerals 1102 and 1106 indicate a third interlayer film and first interlayer film in FIG. 12A and numerals 1109, 1110, 1111, and 1112 are denoted as a third interlayer film, a second interlayer film, and source electrodes in FIG. 12B, respectively.

Figure 1:
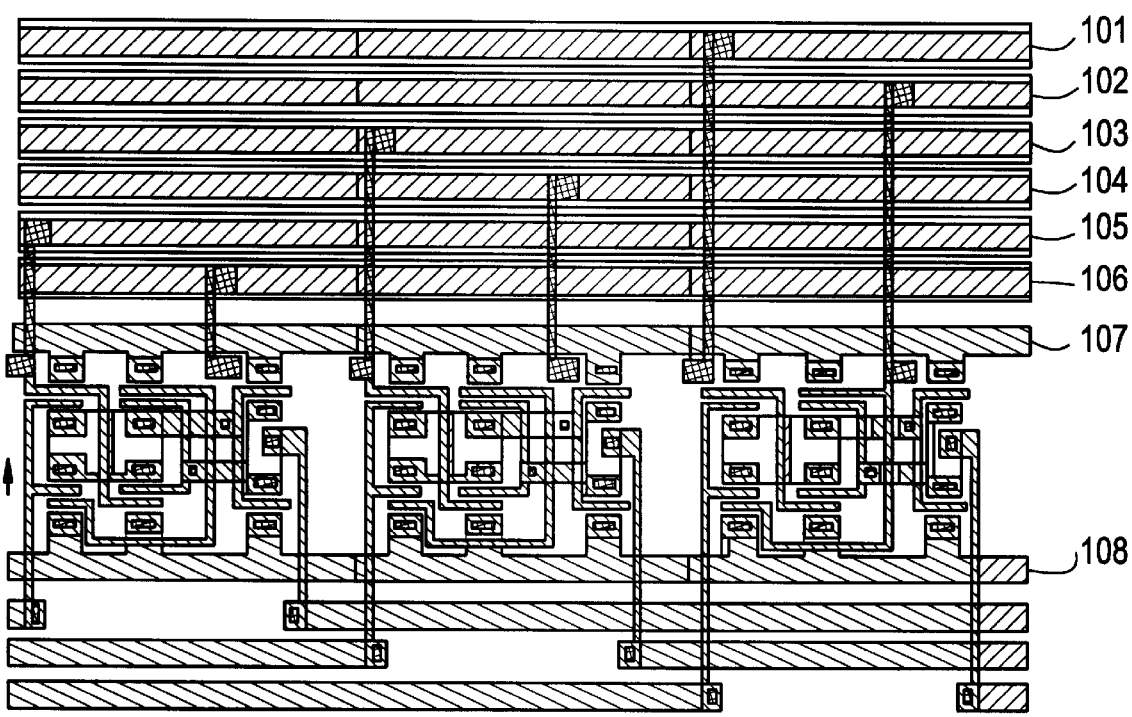
FIG. 1 is a view showing a first embodiment (shift register) of the present invention.
Figure 2:
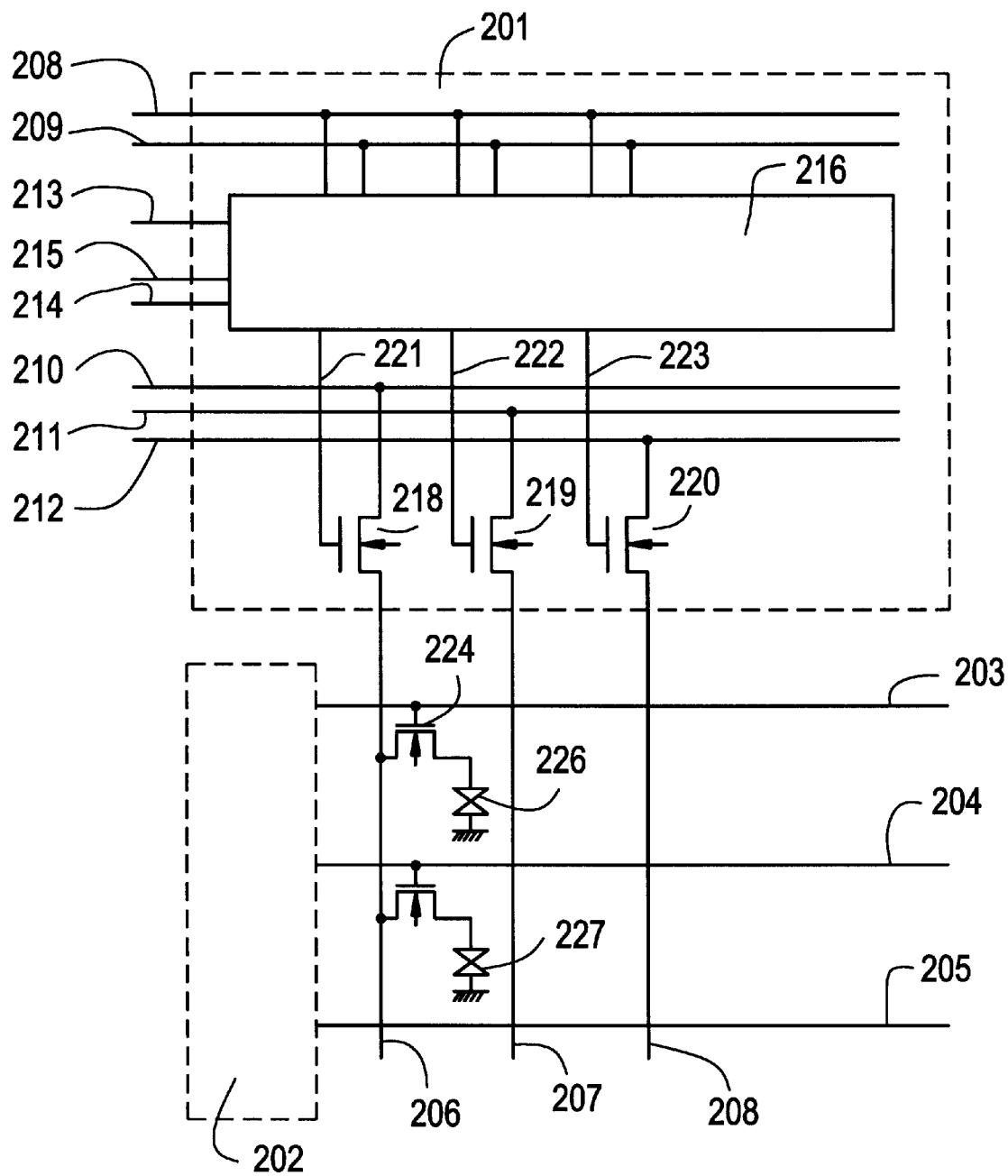
FIG. 2 is a schematic view showing a conventional liquid crystal display device.
Figure 3:
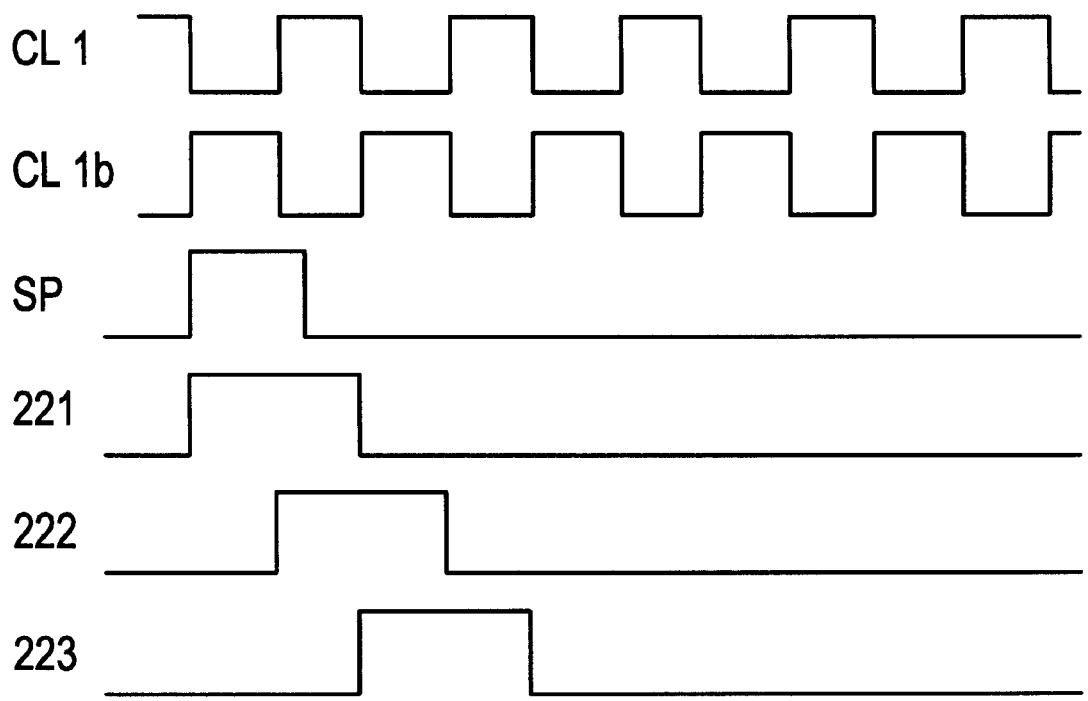
FIG. 3 is a view showing operation waveforms of a shift register.
Figure 4A:
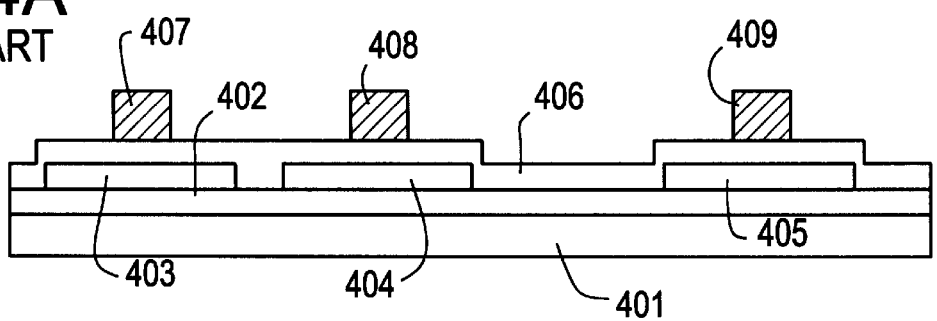
FIGS. 4A to 4D are sectional views showing manufacturing steps of a conventional liquid crystal display device.
Figure 4B:
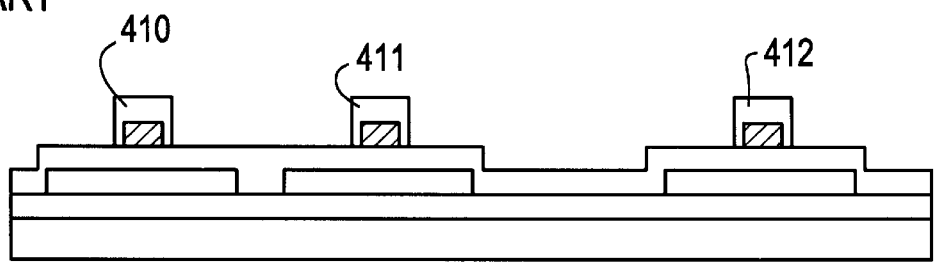
Figure 4C:
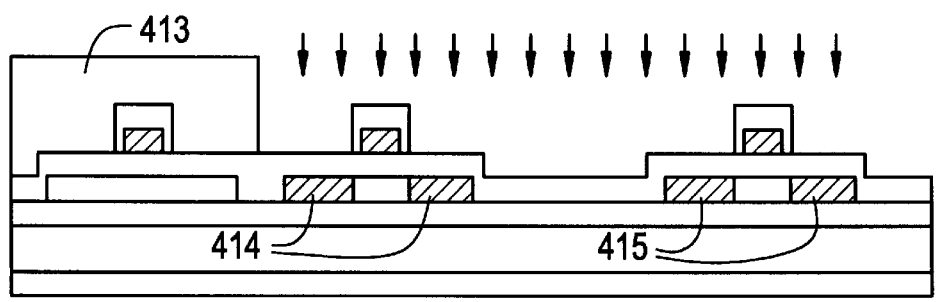
Figure 4D:
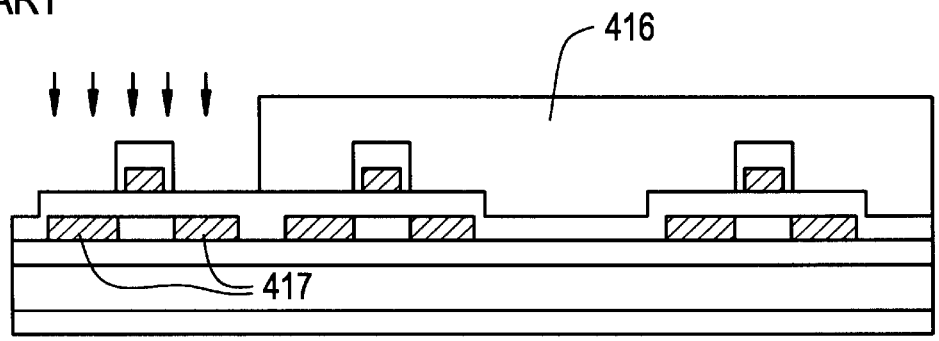
Figure 5A:
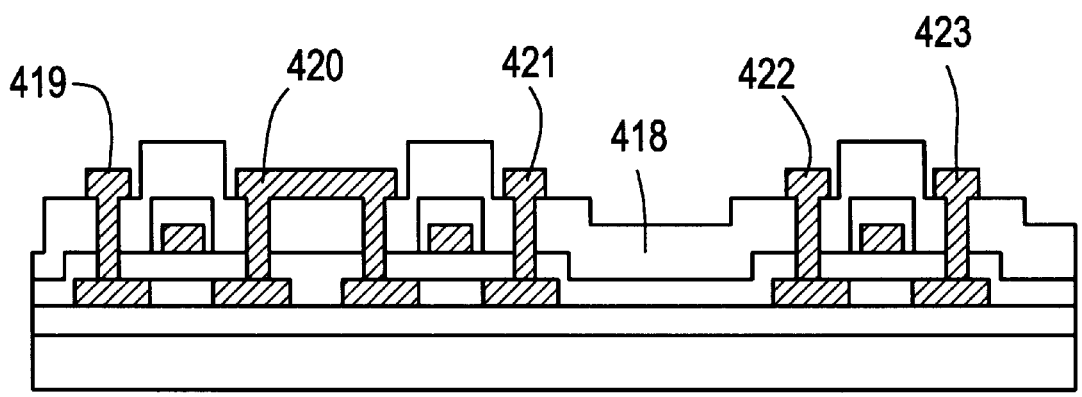
FIGS. 5A and 5B are sectional views showing the manufacturing steps.
Figure 5B:
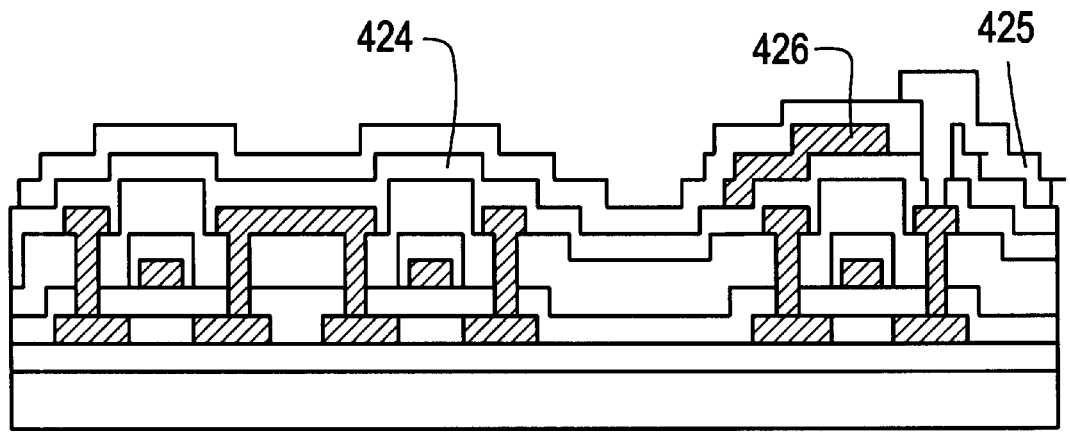

FIG. 1 is a plan view showing a shift register portion of the first embodiment. Numerals 101 to 106 indicate clock lines and numerals 107 and 108 indicate power supply terminals, respectively.

As described before, the sheet resistance of source/drain electrodes is 0.2 $\Omega$, and the sheet resistance of a gate electrode is 0.3 $\Omega$. A clock line is made of a wiring line of a source electrode material with a width of 30 $\mu$m and a wiring line of a gate electrode material with a width of 20 $\mu$m under the wiring line of the source electrode material.

In the case where one stage of a shift register is made 250 $\mu$m like the prior art, the resistance of the clock line per one stage becomes 1.15 $\Omega$.

With respect to a wiring delay at this time, the inter-wiring capacitance between wiring lines per one stage is not changed, and the wiring cross capacitance is almost halved by using the same layer as a black matrix for a cross wiring line, so that a delay time at the end of the wiring is 1.62 ns. As compared with the prior art, the improvement of 42% can be seen.

(Embodiment 2)

Figure 6:
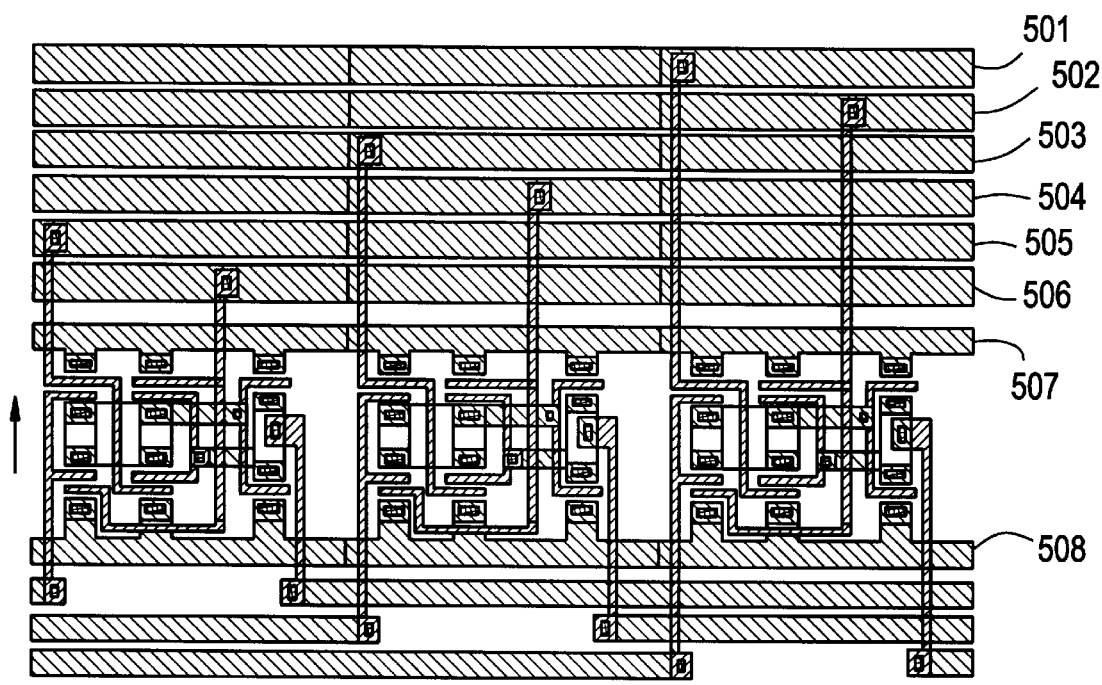
FIG. 6 is a plan view showing a conventional shift register.
Figure 13:
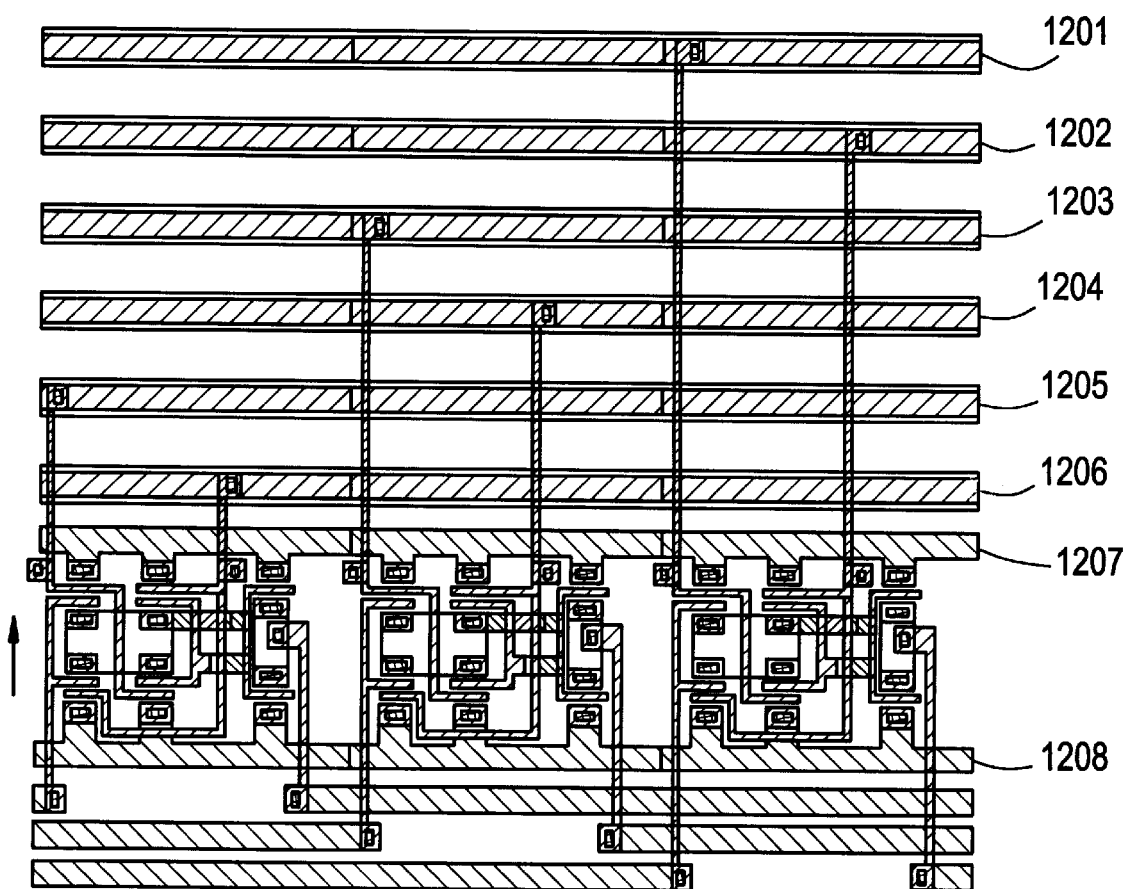
FIG. 13 is a view showing a second embodiment (shift register) of the present invention.

FIG. 13 is a plan view showing a shift register portion of a driving circuit of a liquid crystal display device according to embodiment 2. Numerals 1201 to 1206 indicate clock lines and numerals 1207 and 1208 indicate power supply terminals, respectively. As compared with the prior art (FIG. 6) and the embodiment 1, the interval between clock wiring lines is widened so that the inter-wiring capacitance is reduced. When the distance between the wiring lines is changed from 5 $\mu$m to 40 $\mu$m, the inter-wiring capacitance between wiring lines becomes 0.32 fF/$\mu$m. When the wiring length is 250 $\mu$m, the inter-wiring capacitance of 16.0 fF is generated. The total capacitance including the cross capacitance becomes 24.6 fF. At this time, the delay time at the wiring end of connection of 300 stages is 1.02 ns. As compared with the prior art, the improvement of 64% can be seen.

Figure 14:
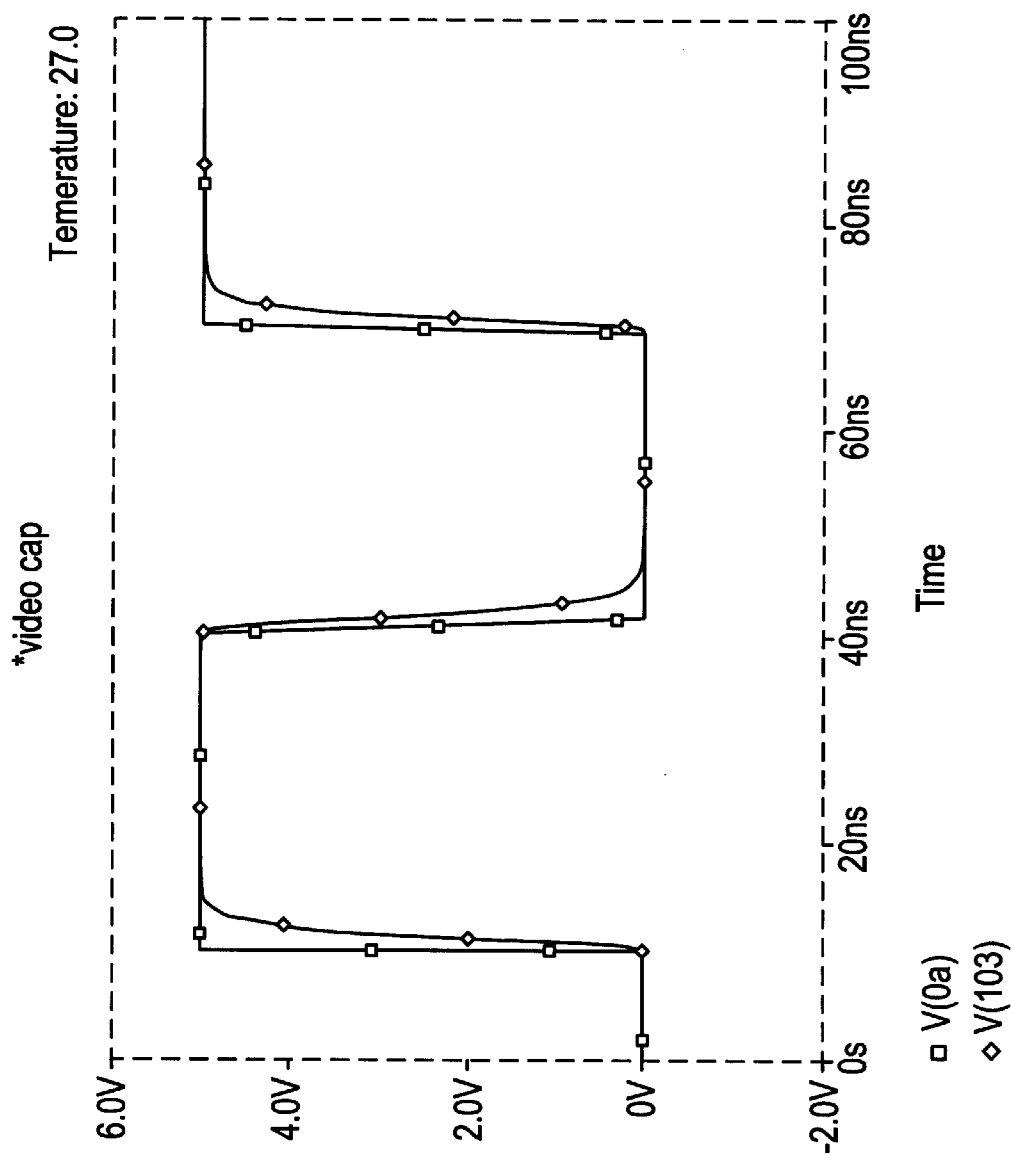
FIG. 14 is a view showing the result of simulation of the second embodiment.

FIG. 14 shows the simulation result of a clock delay time.

(Embodiment 3)

Figure 15:
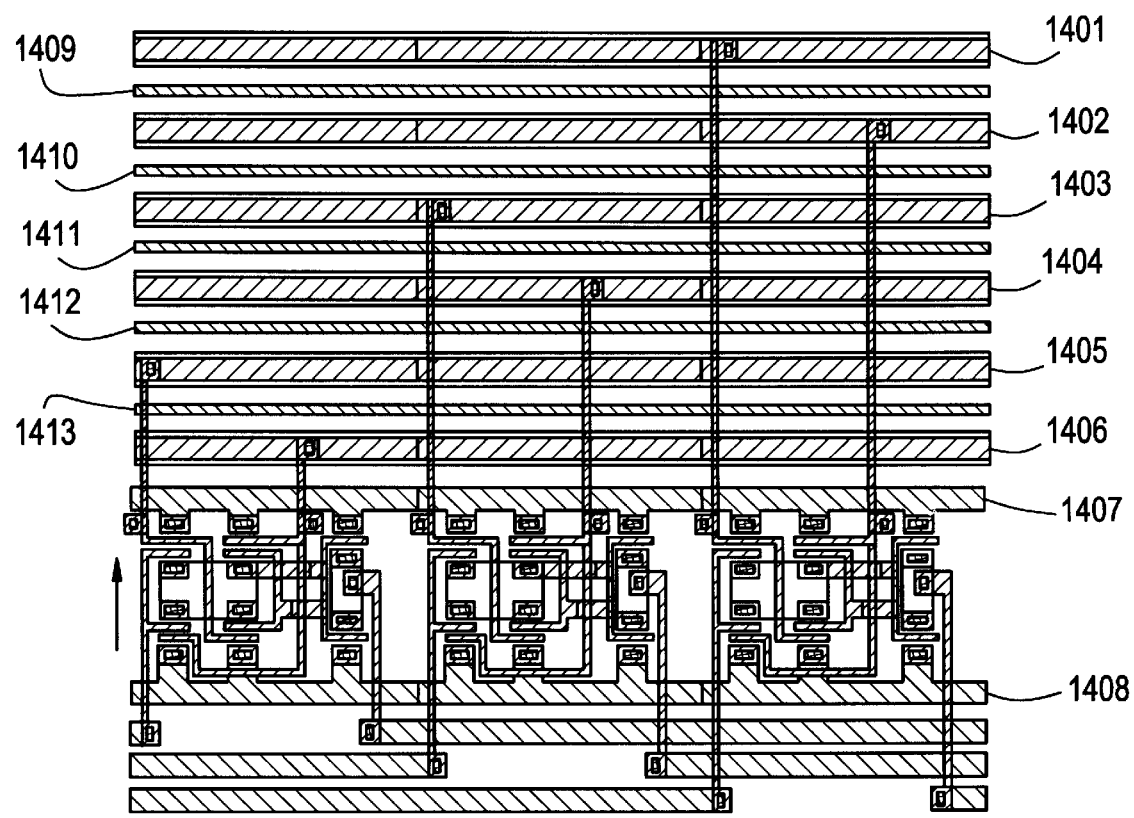
FIG. 15 is a view showing a third embodiment (shift register) of the present invention.

FIG. 15 is a plan view showing a shift register portion of the embodiment 3. Numerals 1401 to 1406 indicate clock lines, numerals 1407 and 1408 indicate power supply terminals, and numerals 1409 to 1413 indicate shield lines, respectively.

In this embodiment, a shield line at a fixed potential is disposed between clock lines. Although inter-wiring capacitance is newly generated with respect to the shield line, the capacitance between the clock lines is reduced and mutual interference between clock signals can be reduced.

(Embodiment 4)

Figure 16:
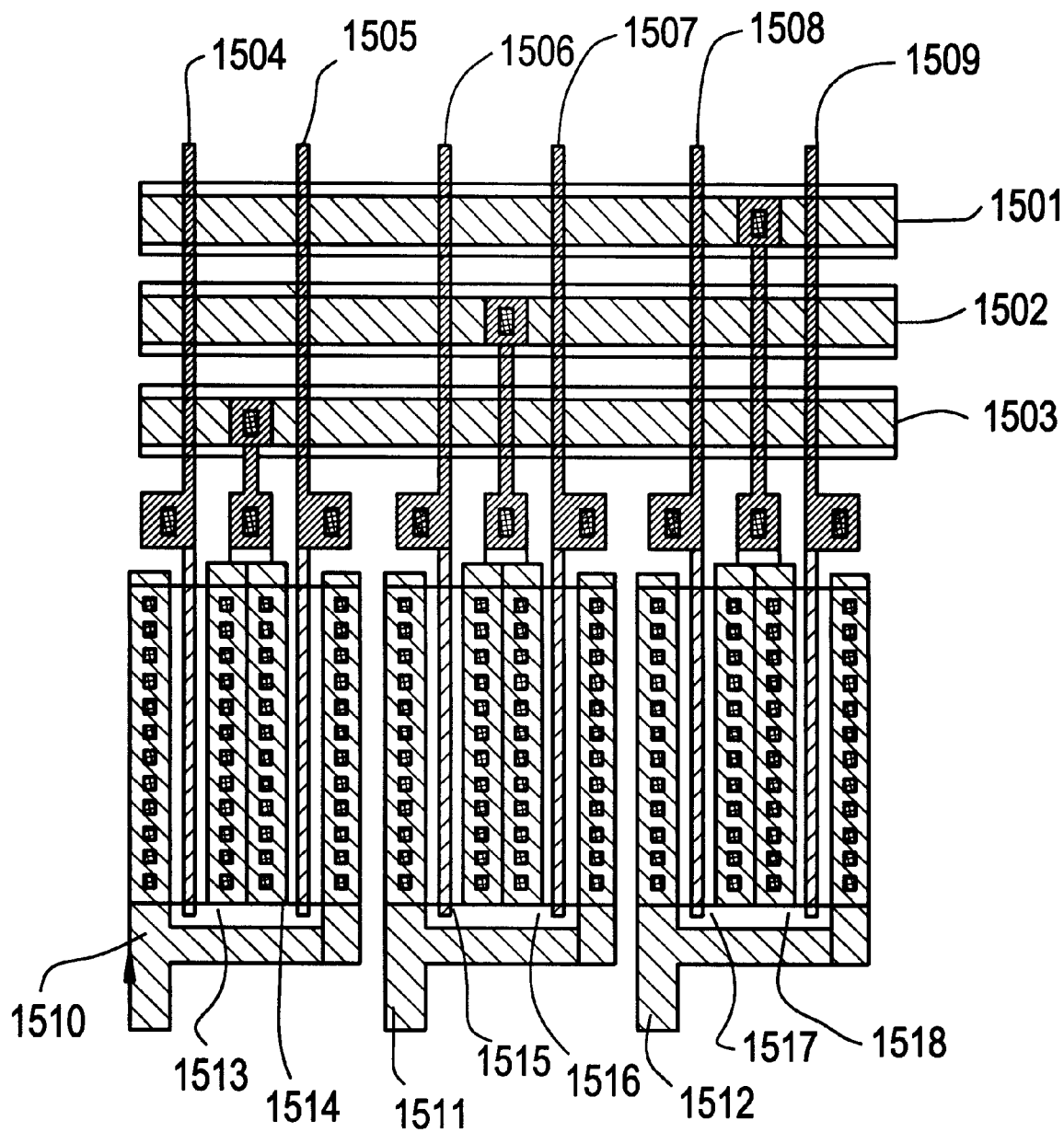
FIG. 16 is a view showing a fourth embodiment (analog switch) of the present invention.

FIG. 16 is a plan view showing an analog switch of embodiment 4. Numerals 1501 to 1503 indicate video signal lines, numerals 1504 to 1509 indicate outputs of the shift register, numerals 1510 to 1512 indicate signal lines, and numerals 1513 to 1518 indicate analog switch transistors, respectively.

Figure 10:
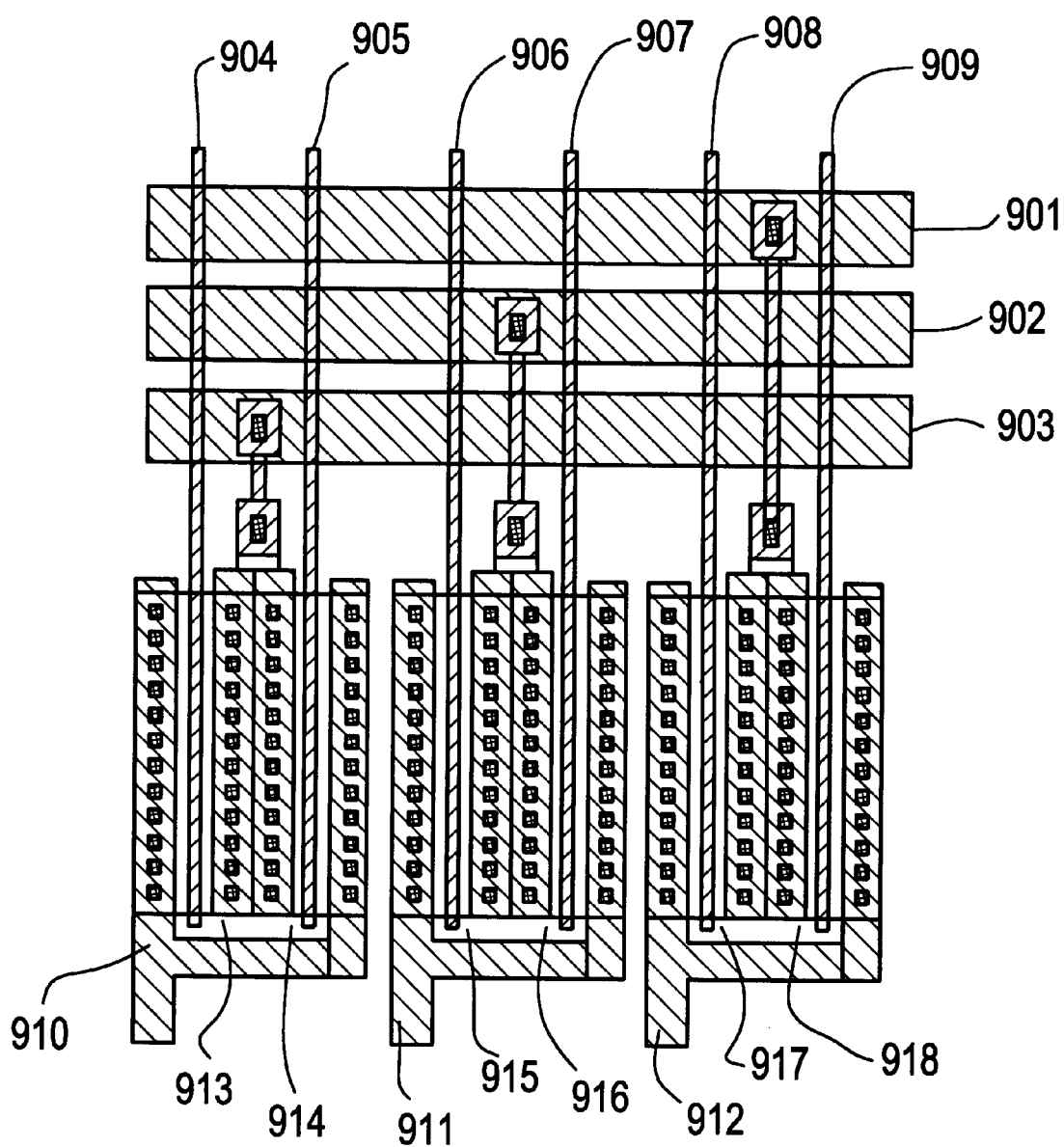
FIG. 10 is a plan view showing a conventional analog switch.
Figure 11:
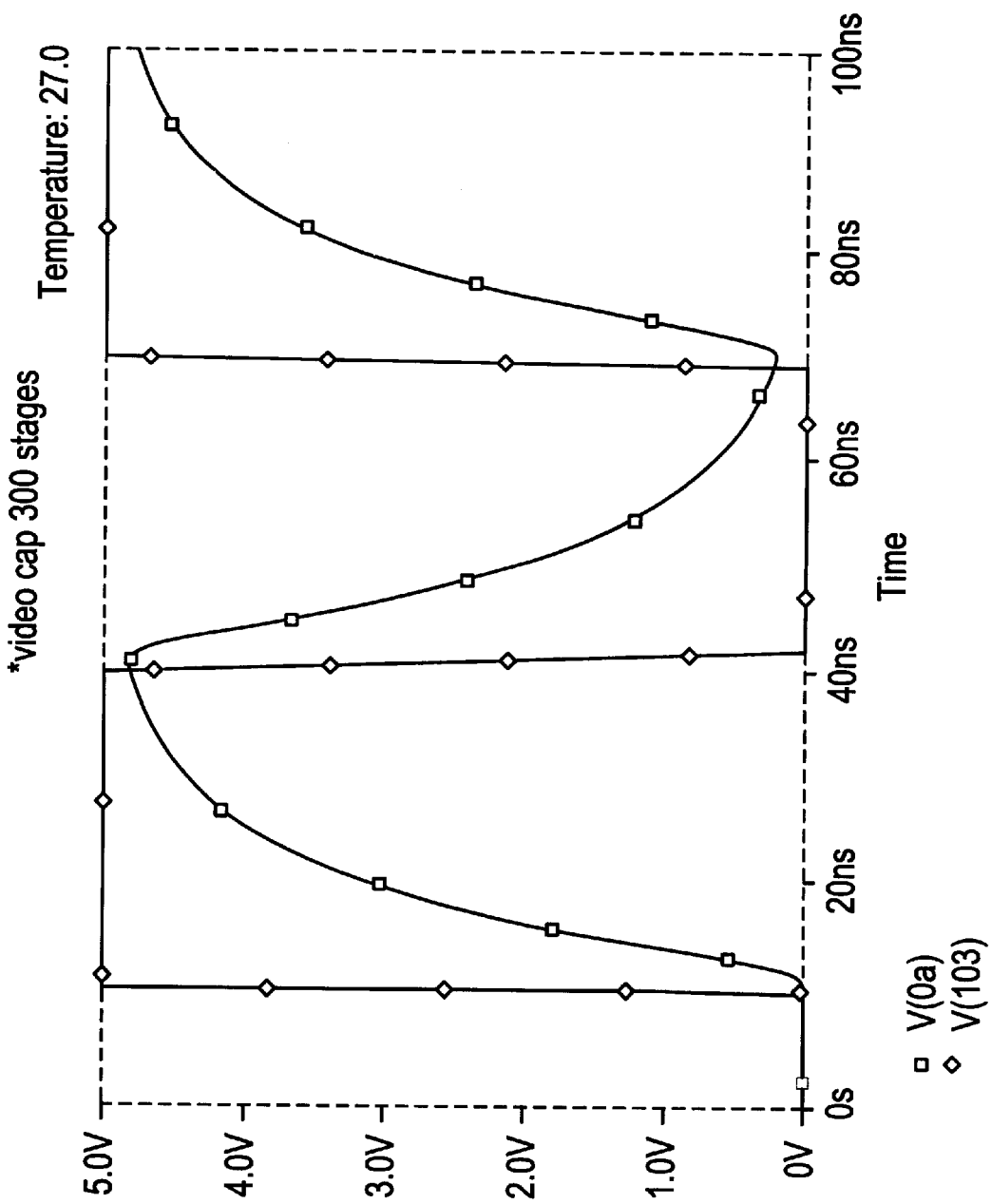
FIG. 11 is a view showing the result of wiring delay time simulation of a conventional analog switch.

Like the shift register, as compared with the prior art (FIG. 10), the video signal lines 1501 to 1503 are made of two layers of gate electrodes and source electrodes, so that wiring resistance becomes small. With respect to the wiring, like the shift register, the sheet resistance of source/drain electrodes is 0.2 $\Omega$ as described before, and the sheet resistance of the gate electrode is 0.3 Ω. The video signal line is made of a wiring line of the source electrode material with a width of 30 μm and a wiring line of the gate electrode material with a width of 20 μm under the wiring line of the source electrode material.

Similarly to the prior art, in the case where the analog switch is made 300 μm, the resistance of the video signal line per one stage becomes 1.38 Ω. The wiring cross capacitance is almost halved by using the same layer as a black matrix for a cross wiring line, and becomes 41.4 fF. The delay time at the wiring end is 3.75 ns.

The improvement of 55% as compared with the prior art can be seen.

(Embodiment 5)

Figure 17:
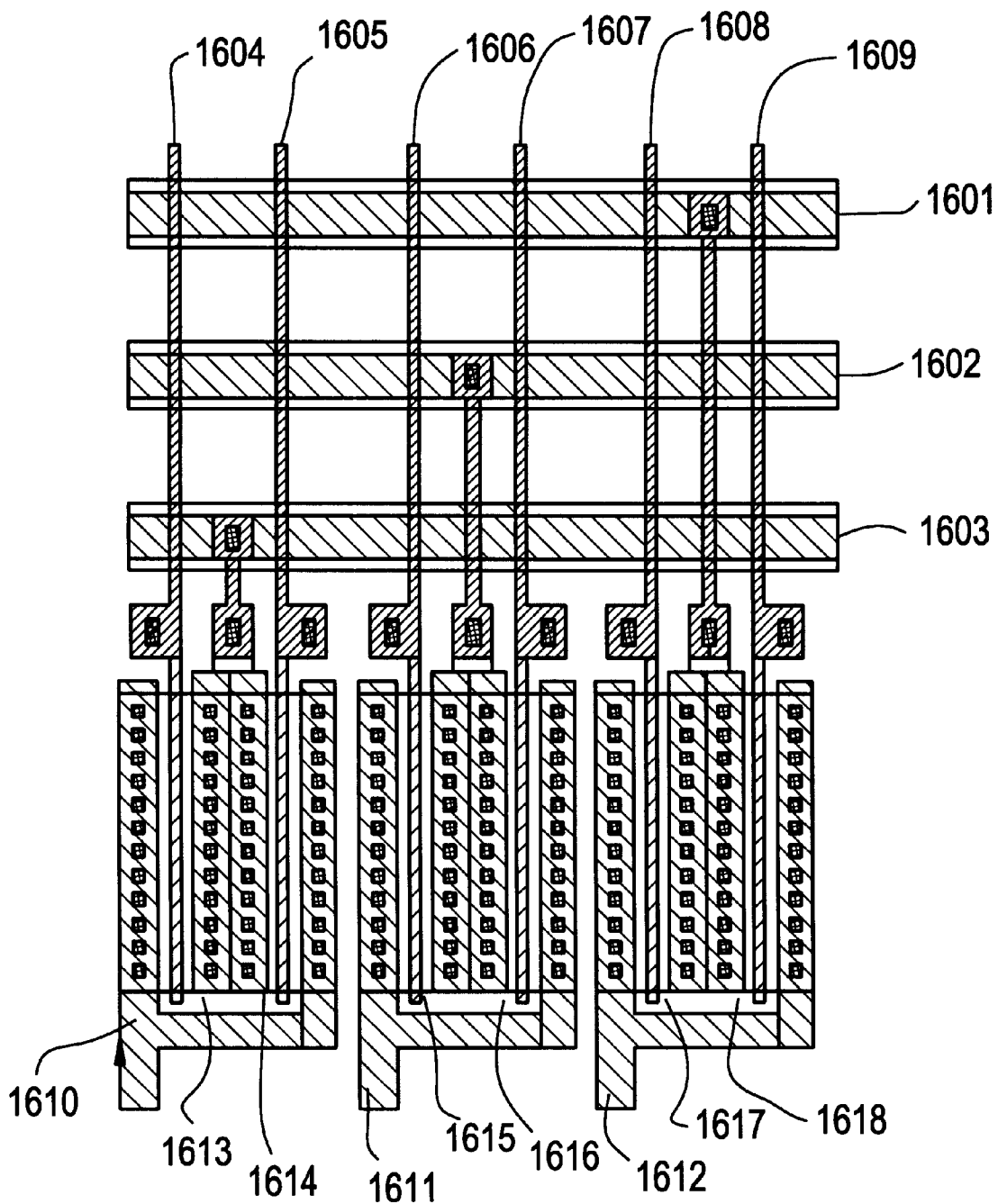
FIG. 17 is a view showing a fifth embodiment (analog switch) of the present invention.

FIG. 17 is a plan view showing an analog switch of embodiment 5. Numerals 1601 to 1603 indicate video signal lines, numerals 1604 to 1609 indicate outputs of the shift register, numerals 1610 to 1612 indicate signal lines, and numerals 1613 to 1618 indicate analog switch transistors, respectively.

Figure 7:
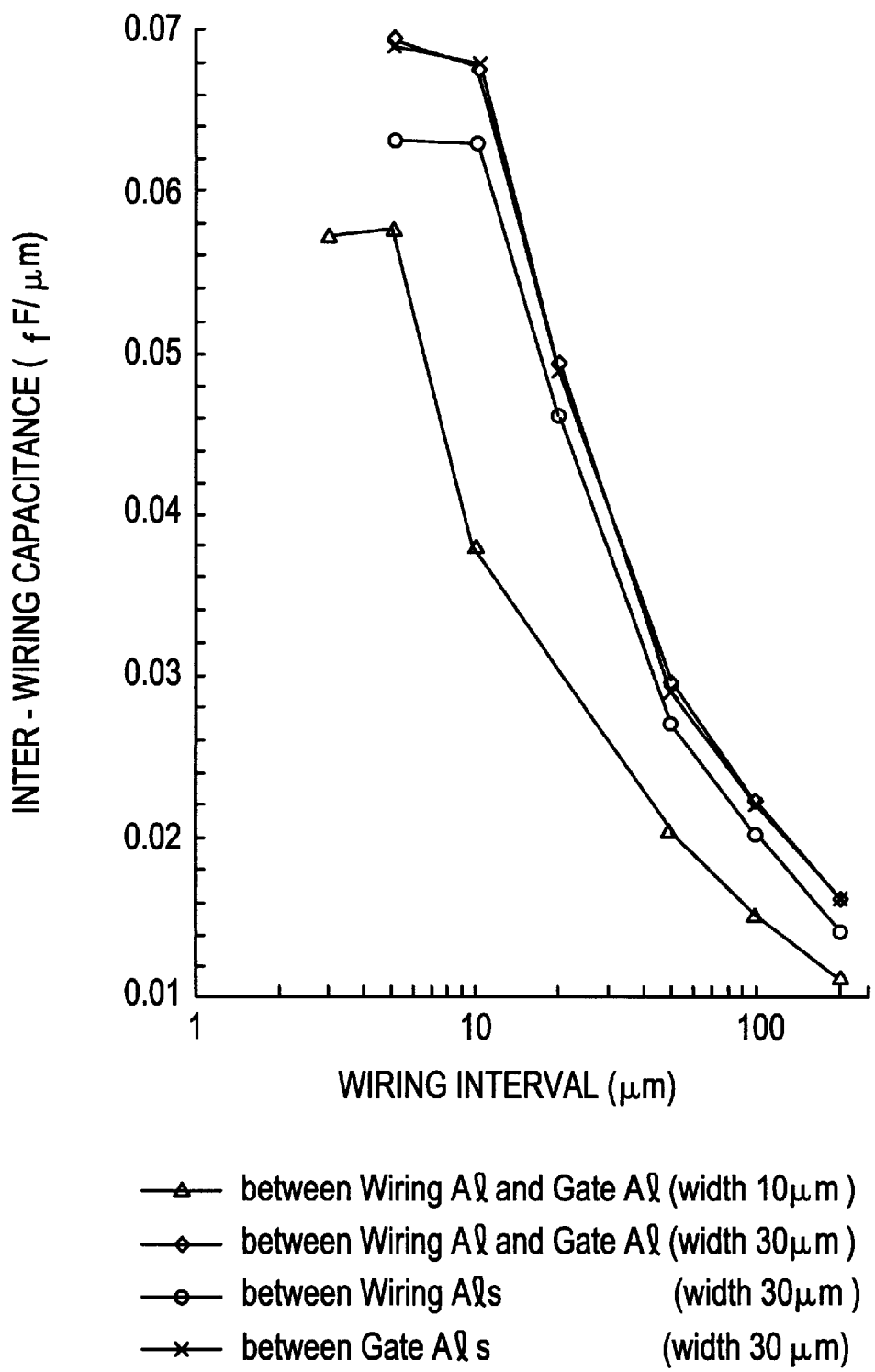
FIG. 7 is a graph showing the relation between inter-wiring capacitance and wiring interval.
Figure 8:
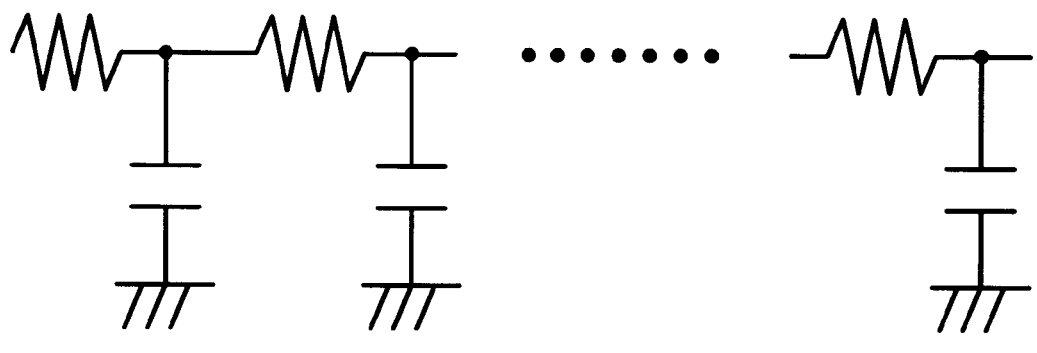
FIG. 8 is a view showing a simulation circuit for a wiring delay time.

As compared with the prior art (FIG. 10) and the embodiment 4, the interval between video signal lines is widened, so that the inter-wiring capacitance between wiring lines becomes small. When the distance between the wiring lines is changed from 5 μm, which is a conventional value, to 40 μm, the inter-wiring capacitance becomes 0.032 fF/μm as shown in FIG. 7. When the wiring length is 300 μm, the inter-wiring capacitance of 19.2 fF is generated. The total capacitance including the cross capacitance is 60.6 fF. A delay time at the wiring end of connection of 300 stages is 2.88 ns. As compared with the prior art, the improvement of 65% can be seen.

Figure 18:
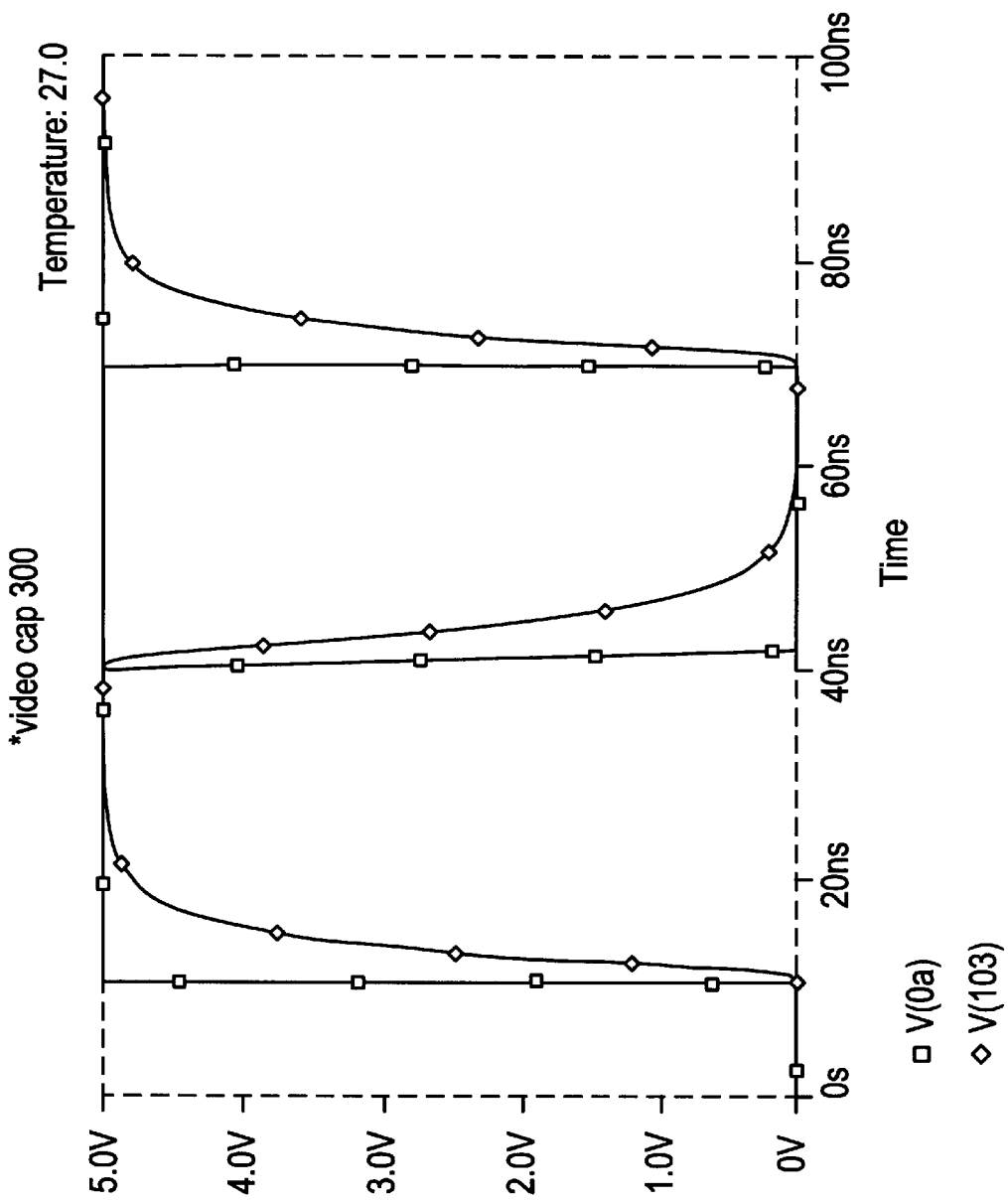
FIG. 18 is a view showing the result of simulation of the fifth embodiment.

FIG. 18 shows the simulation result of a delay time of a video signal.

(Embodiment 6)

Figure 19:
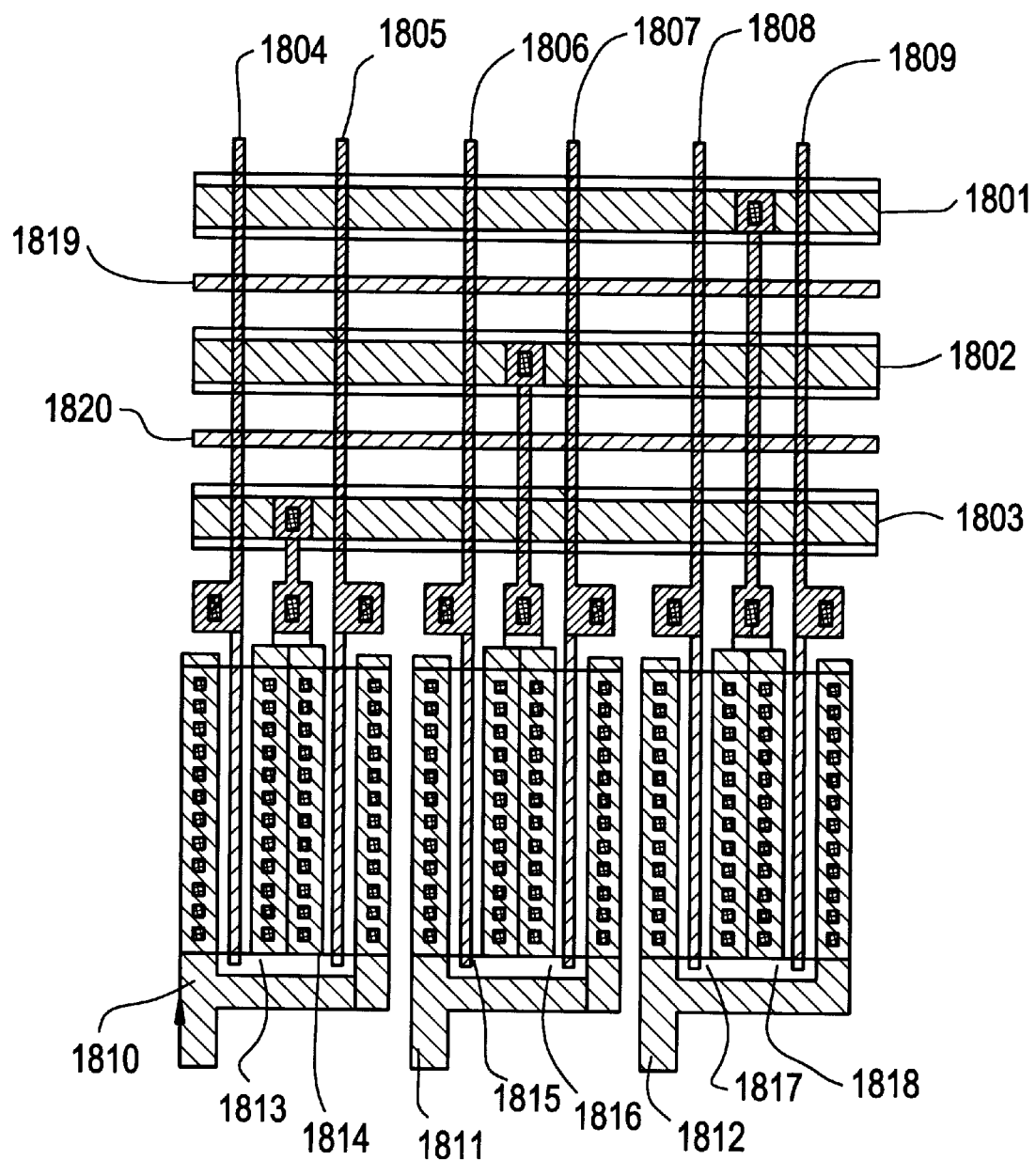
FIG. 19 is a view showing a sixth embodiment (analog switch) of the present invention.

FIG. 19 is a plan view sowing an analog switch of embodiment 6. Numerals 1801 to 1803 indicate video signal lines, numerals 1804 to 1809 indicate outputs of the shift register, numerals 1810 to 1812 indicate signal lines, numerals 1813 to 1818 indicate analog switch transistors, and numerals 1819 to 1820 indicate shield lines, respectively.

In this embodiment, a shield line at a fixed potential is disposed between video signal lines. Although the inter-wiring capacitance with respect to the shield line is newly generated, the capacitance between video signal lines is reduced and the mutual interference between video signals can be reduced.

As described above, in the driving circuit of the liquid crystal display device according to the present invention, each of clock lines, video signal lines, and control signal lines is made of a two-layer structure of a gate electrode material and a source/drain electrode material, so that wiring resistance is lowered. Moreover, a wiring line crossing those wiring lines is made of a wiring material in the same layer as a black matrix on a TFT, so that the parasitic capacitance is reduced. Thus the present invention has an effect that the frequency characteristics can be improved.

Moreover, the present invention has effects that the wiring interval of the clock lines, video signal lines, and the like is made twice or more the wiring width, so that the inter-wiring capacitance between wiring lines is lowered and the frequency characteristics is improved.

Moreover, a shield line is inserted between clock lines or video signal lines, so that the mutual interference between clock lines or video signal lines can be suppressed.

From these, the picture quality of the display device can be improved.

What is claimed is:

1. A liquid crystal display device, comprising:
    a first insulating substrate having at least one driving circuit having driver thin film transistors, a plurality of signal lines, a plurality of scan lines, pixel region having pixel thin film transistors, clock lines for supplying clock signals to the driver circuit, black matrices covering the pixel thin film transistors, and wiring lines crossing the clock lines or the base portions of the clock lines;
    a second insulating substrate opposite to the first insulating substrate; and
    a liquid crystal held between the first and second insulating substrates,
    wherein each of the clock lines or each of base portions of the clock lines is made of a two-layer structure, lower layer of said two-layer structure comprising the same wiring material as gate electrodes of the driving and pixel thin film transistors and, upper layer of said two-layer structure comprising the same wiring material as source and drain electrodes of the driving and pixel thin film transistors, and
    wherein said wiring lines are made of the same layer as the black matrices.

2. A device according to claim 1, wherein an interval between adjacent ones of the clock lines is wider than a width of each of the clock lines.

3. A liquid crystal display device comprising:
    a first insulating substrate having at least one driving circuit having driver thin film transistors, a plurality of signal lines, a plurality of scan lines, pixel region having pixel thin film transistors, clock lines for supplying clock signals to the driver circuit, black matrices covering the pixel thin film transistors, and at least one shielding line biased at a fixed potential;
    a second insulating substrate opposite to the first insulating substrate; and
    a liquid crystal held between the first and second insulating substrates, wherein said shielding line is disposed on an interval between the clock lines or base portions of the clock lines over the first insulating substrate.

4. A liquid crystal display device comprising:
    a first insulating substrate having a plurality of signal lines, a plurality of scan lines, at least one driving circuit having driver thin film transistors, pixel region having pixel thin film transistors, video signal lines for supplying video signals to the driving circuit, black matrices covering the pixel thin film transistors, and wiring lines crossing the video signal lines or the base portions of the video signal lines;
    a second insulating substrate opposite to the first insulating substrate; and
    a liquid crystal held between the first and second insulating substrates,
    wherein each of the video signal lines or each of base portions of the video signal lines is made of a two-layer structure, lower layer of said two-layer structure comprising the same wiring material as gate electrodes of the driver and pixel thin film transistors and, upper layer of said two-layer structure comprising the same wiring material as source and drain electrodes of the driver and pixel thin film transistors, and wherein said wiring lines are made of the same layer as the black matrices.

5. A device according to claim 4, wherein an interval between adjacent ones of the video signal lines is wider than a width of each of the video signal lines.

6. A liquid crystal display device comprising:
   a first insulating substrate having at least one driving circuit having driver thin film transistors, a plurality of signal lines, a plurality of scan lines, pixel region having pixel thin film transistors, video signal lines for supplying video signals to the driving circuit, and black matrices covering the pixel thin film transistors, and at least one shielding line biased at a fixed potential;
   a second insulating substrate opposite to the first insulating substrate; and
   a liquid crystal held between the first and second insulating substrates,
   wherein said shielding line is disposed on an interval between the video signal lines or base portions of the video signal lines.

7. A device according to claim 1, wherein said clock lines are connected to a shift register circuit in the driver circuit.

8. A device according to claim 3, wherein said clock lines are connected to a shift register circuit in the driver circuit.

9. A device according to claim 4, wherein said video signal lines are connected to an analog switch circuit in the driver circuit.

10. A device according to claim 6, wherein said video signal lines are connected to an analog switch circuit in the driver circuit.

11. A semiconductor device having at least a pixel region and a driving circuit over a substrate, each comprising a plurality of thin film transistors, said semiconductor device comprising:
    clock lines for supplying clock signals to the driving circuit;
    black matrices covering the thin film transistors; and
    wiring lines crossing the clock lines or the base portions of the clock lines,
    wherein each of the clock lines is made of a two-layer structure, lower layer of said two-layer structure comprising the same wiring material as gate electrodes of the thin film transistors and, upper layer of said two-layer structure comprising the same wiring material as source and drain electrodes of the thin film transistors, and
    wherein said wiring lines are made of the same layer as the black matrices.

12. A device according to claim 11, wherein an interval between adjacent ones of the clock lines is wider than width of the clock lines themselves.

13. A device according to claim 11, wherein said clock lines are connected to a shift register circuit in the driver circuit.

14. A semiconductor device having at least a pixel region and a driving circuit over a substrate, each comprising a plurality of thin film transistors, said semiconductor device comprising:
    clock lines for supplying clock signals to the driving circuit over said substrate,
    shield lines over said substrate, each shield line disposed on an interval between said clock lines; and
    black matrices covering the thin film transistors;
    wherein each of the clock lines is made of a two-layer structure, lower layer of said two-layer structure comprising the same wiring material as gate electrodes of the thin film transistors and, upper layer of said two-layer structure comprising the same wiring material as source and drain electrodes of the thin film transistors, and
    wherein said shield lines are biased at a fixed potential.

15. A device according to claim 14, wherein said clock lines are connected to a shift register circuit in the driver circuit.

16. A semiconductor device having at least a pixel region and a driving circuit over a substrate, each comprising a plurality of thin film transistors, said semiconductor device comprising:
    video signal lines for supplying video signals to the driving circuit, and black matrices covering the thin film transistors;
    black matrices covering the thin film transistors; and
    wiring lines crossing the video signal lines or the base portions of the video signal lines,
    wherein each of the video lines is made of a two-layer structure, lower layer of said two-layer structure comprising the same wiring material as gate electrodes of the thin film transistors and, upper layer of said two-layer structure comprising the same wiring material as source and drain electrodes of the thin film transistors, and
    wherein said wiring lines are made of the same layer as the black matrices.

17. A device according to claim 16, wherein an interval between adjacent ones of the video signal lines is wider than width of the video signal lines themselves.

18. A device according to claim 16, wherein said video signal lines are connected to an analog switch circuit in the driver circuit.

19. A semiconductor device having at least a pixel region and a driving circuit over a substrate, each comprising a plurality of thin film transistors, said semiconductor device comprising:
    video signal lines for supplying video signals to the driving circuit, shield lines disposed between said video signal lines; and
    black matrices covering the thin film transistors;
    wherein each of the video lines is made of a two-layer structure, lower layer of said two-layer structure comprising the same wiring material as gate electrodes of the thin film transistors and, upper layer of said two-layer structure comprising the same wiring material as source and drain electrodes of the thin film transistors, and
    wherein said shield lines are biased at a fixed potential.

20. A device according to claim 19, wherein said video signal lines are connected to an analog switch circuit in the driver circuit.

* * * * *